United States Patent [19]

Furrey et al.

[11] Patent Number: 5,455,636
[45] Date of Patent: Oct. 3, 1995

[54] DETECTOR CIRCUIT FOR USE IN A VCR

[75] Inventors: John H. Furrey, Indianapolis; Sung J. Kim, Fishers, both of Ind.

[73] Assignee: Thomson Consumer Electronics, Inc., Indianapolis, Ind.

[21] Appl. No.: 400,426

[22] Filed: Mar. 6, 1995

Related U.S. Application Data

[63] Continuation of Ser. No. 264,222, Jun. 22, 1994, abandoned, which is a continuation of Ser. No. 807,069, Dec. 13, 1991, abandoned.

[51] Int. Cl.⁶ .............................. H04N 5/44; H04N 5/50
[52] U.S. Cl. .................... 348/731; 348/734; 348/732; 358/335
[58] Field of Search .................... 348/731–734, 348/725–729, 10; 380/10, 52; 455/3, 4, 6, 352, 353; 358/335; H04N 7/18, 5/44, 5/50

[56] References Cited

U.S. PATENT DOCUMENTS

| | | | |
|---|---|---|---|
| 4,543,614 | 9/1985 | Chen | 358/193.1 |
| 4,688,082 | 8/1987 | Kato | 358/23 |
| 4,868,660 | 9/1989 | Rufray | 358/191.1 |
| 5,020,139 | 5/1991 | Keenan | 358/194.1 |
| 5,020,140 | 5/1991 | Teskey | 358/194.1 |
| 5,046,093 | 9/1991 | Wachob | 358/194.1 |
| 5,123,046 | 6/1992 | Levine | 358/194.1 |
| 5,151,789 | 9/1992 | Young | 358/194.1 |
| 5,297,204 | 3/1994 | Levine | 348/734 |
| 5,329,376 | 7/1994 | Kim et al. | 348/731 |

FOREIGN PATENT DOCUMENTS

| | | |
|---|---|---|
| 0067585 | 12/1982 | European Pat. Off. ............... 358/174 |
| 54-157433 | 12/1979 | Japan . |
| 60-152184 | 8/1985 | Japan . |
| 2251146 | 6/1992 | United Kingdom . |

*Primary Examiner*—James J. Groody
*Assistant Examiner*—Michael H. Lee
*Attorney, Agent, or Firm*—Joseph S. Tripoli; Peter M. Emanuel; Thomas F. Lenihan

[57] ABSTRACT

Apparatus in accordance with the subject invention controls a cable box (i.e., the source of its own video input signals), and monitors the television signals received from the cable box, in a "closed loop" manner. By monitoring an appropriate signal the controller of the VCR can detect perturbations of signal level which indicate that the cable box has changed channels. It is herein recognized that such an appropriate signal can be taken across the filter capacitor of a either sync or AGC portions of a video processor of the VCR.

9 Claims, 3 Drawing Sheets

DETECTOR CIRCUIT FOR USE IN A VCR

This is a continuation of application of Ser. No. 08/264,222, filed Jun. 22, 1994, which is a continuation of application Ser. No. 07/807,069, filed Dec. 12, 1991, both are abandoned now.

FIELD OF THE INVENTION

The subject application concerns the field of videocassette recorders (VCRs) and apparatus for programming them.

CROSS REFERENCE TO RELATED APPLICATIONS

The subject patent application is related to applications bearing U.S. patent application Ser. Nos. 807,472, 806,916, 806,551; 806,918, 806,917, and 807,068 filed herewith, and assigned to the same assignee as the subject invention.

BACKGROUND OF THE INVENTION

When a television set owner is a subscriber to a cable television system and also possesses a videocassette recorder (VCR), he may be required to connect to the cable system via a cable decoder box (also called a CATV converter, or a set-top converter). This connection may be required, because in these systems, many cable channels (i.e., the so-called premium channels) are scrambled (i.e., encoded or encrypted) and must be descrambled (i.e., decoded or decrypted) in the cable box. The cable box descrambles the premium channel and converts its RF carrier frequency from its assigned cable channel frequency to a cable box output frequency, normally that of channel 2, 3, 4, or 5 for reception and recording by the VCR, or display by the television receiver. In such an arrangement the viewer may have as many as three remote control units for controlling the video equipment (i.e., one each for a television set, a VCR, and the cable box).

Recently, a programming simplification system known as VCR PLUS™, manufactured by Gemstar Development Corporation, Pasadena, Calif., has become available. Briefly, the apparatus of the VCR PLUS™ system resembles a standard remote control handunit. The handunit is preprogrammed with the codes for controlling the VCRs and cable control boxes of many manufacturers. The handunit is then programmed by the user with a unique code comprising 1 to 8 digits, which code corresponds to a particular television show broadcast on a given channel, at a given time and date, and having a given duration. A television show which is broadcast at the most popular viewing time (for example, 7 pm) may have a code which comprises only 1 digit. Conversely, a television show which is broadcast at the least popular viewing time (for example, 3 am) may have a code which comprises the full 8 digits. These codes are printed in the channel guide section of the viewer's local newspaper along with the normal time and channel information. After entering the unique 1 to 8 digit code for a particular television show to be recorded, the user places the handunit in a cradle mounted on his VCR to ensure that the handunit is in the proper orientation for transmitting data to the IR (infrared) receiver of the VCR and to the cable box. At the proper time, the VCR PLUS™ handunit transmits IR codes to the cable box to turn it on and tune it to the desired channel, and to the VCR to turn it on and program it to record the desired television show.

Unfortunately, the stand alone VCR PLUS™ handunit operates in an "open-loop" mode. That is, the VCR PLUS™ handunit has no way of knowing if its commands were actually received and executed by either the VCR or by the cable box because no feedback signal to the VCR PLUS™ handunit exists.

SUMMARY OF THE INVENTION

Apparatus in accordance with the subject invention controls a cable box (i.e., the source of its own video input signals), and monitors the television signals received from the cable box, in a "closed loop" manner. By monitoring an appropriate signal the controller of the VCR can detect perturbations of signal level which indicate that the cable box has changed channels. It is herein recognized that such an appropriate signal can be taken across a filter capacitor of either sync or AGC portions of a video processor of the VCR.

DETAILED DESCRIPTION OF THE EMBODIMENT

Figure 1:
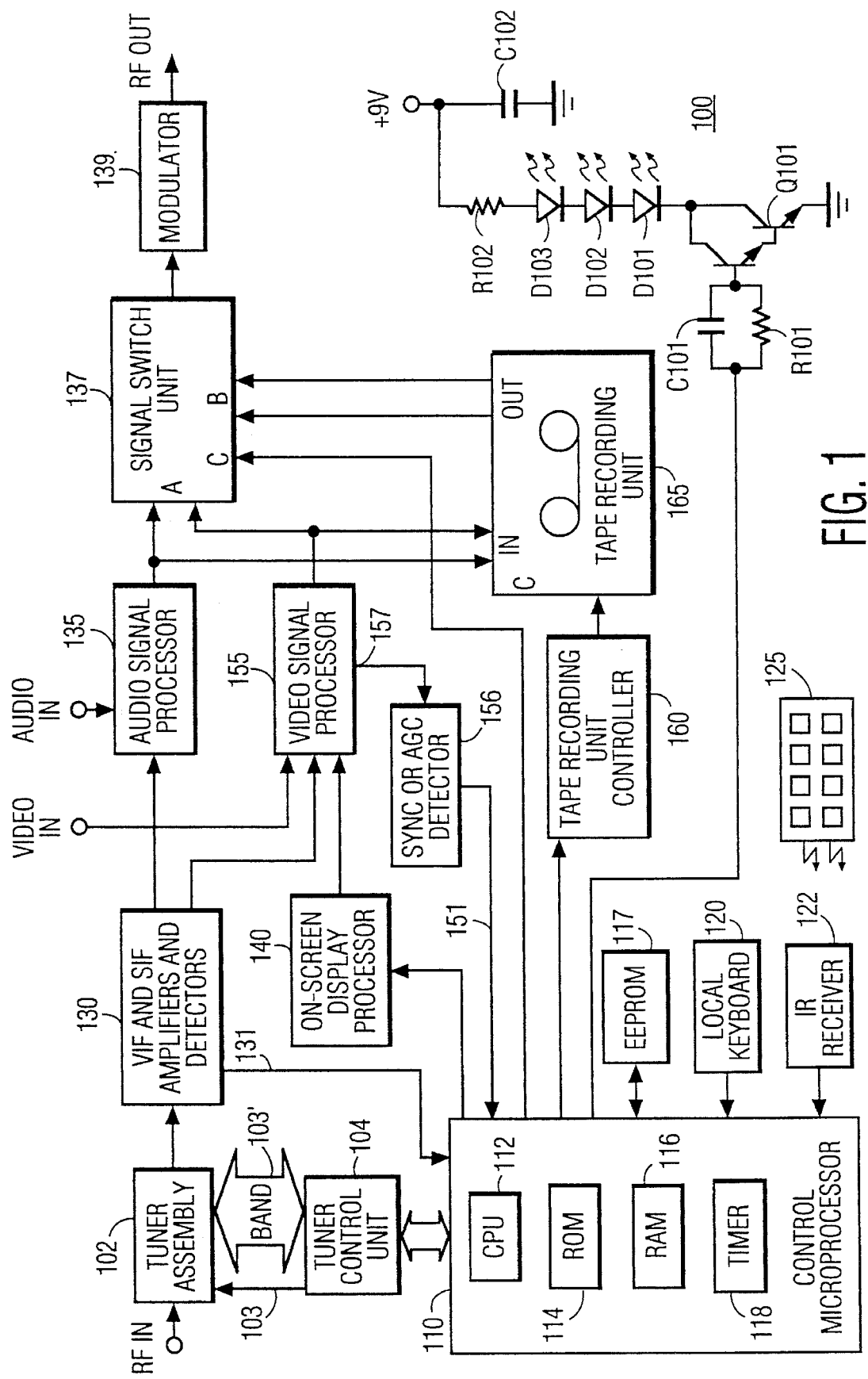
FIG. 1 shows, in block diagram form, a VCR incorporating the subject invention.

Referring to FIG. 1, radio frequency (RF) signals are applied to an RF input terminal of a tuner assembly 102. Tuner assembly 102 selects a particular RF signal under control of a tuner control unit 104 which applies a tuning control signal to tuner assembly 102 via a wire 103, and applies bandswitching signals via a control bus 103'. Tuner control unit 104 is controlled by a controller 110. Controller 110, which may be a microprocessor or microcomputer, includes a central processing unit (CPU) 112, a read-only memory (ROM) 114, a random access memory 116, and an external electrically-erasable read only memory (EEPROM) 117. Controller 110 generates a control signal for causing tuner control unit 104 to control tuner 102 to select a particular RF signal, in response to user-entered control signals from a local keyboard 120 and from an infrared (IR) receiver 122. IR receiver 122 receives and decodes remote control signals transmitted by a remote control unit 125.

Tuner 102 produces a signal at an intermediate frequency (IF) and applies it to a processing unit 130 comprising a video IF (VIF) amplifying stage, an AFT circuit, a video detector, and a sound IF (SIF) amplifying stage. Processing unit 130 produces a first baseband composite video signal (TV), and a sound carrier signal. The sound carrier signal is applied to an audio signal processor unit 135 which includes an audio detector and may include a stereo decoder. Audio signal processor unit 135 produces a first baseband audio signal and applies it to a signal switch unit 137. Second baseband composite video signals and second baseband audio signals may be applied to VIDEO IN and AUDIO IN terminals from an external source.

The first and second baseband video signals (TV) are coupled to a video processor unit 155 (having a selection circuit not shown) and is also applied to signal switch unit 137. Video and audio signals are also applied to a tape recorder unit 165 which causes the signals to be recorded onto video tape. Tape recorder unit 165 has a control input and operates under control of a tape recorder unit controller 160, which may be a microprocessor. Tape recorder unit controller 160 is in turn controlled by control signals from controller 110. Under control of controller 110, an on-screen display processor 140 generates character signals, and applies them to a second input of video signal processor 155, for inclusion in the processed video signal. Signal switch unit 137 is controlled by controller 110 via a control input terminal C to select audio and video signals from audio signal processor 135 and video signal processor 155, or from the output terminals of tape recording unit 165 in the playback mode, and to apply the selected signals to a modulator 139 for modulation onto a particular channel frequency carrier, typically that of channel 3 or channel 4. That portion of the circuitry shown in FIG. 1 which has been described thus far is known from RCA videocassette recorder model VR520.

Unlike the RCA VR520, which has as its main programming feature a TIMER PROGRAM mode of operation, apparatus according to the subject invention may include both a TIMER PROGRAM programming feature and a VCR PLUS™ programming feature. The control program for the above-mentioned features resides in ROM 114 of controller 110. Electrically-erasable programmable read only memory (EEPROM) 117 is coupled to controller 110, and serves as a non-volatile storage element for storing autoprogramming channel data, user-entered channel data, and VCR PLUS™ channel mapping data.

An IR LED driver circuit, generally, designated 100, is coupled to controller 110, for providing IR signals to external units, such as a cable box for a cable TV service. IR LED driver circuit comprises a filter capacitor C102, a current-limiting resistor R102, three series-connected IR LEDs (infrared light emitting diodes) D101, D102, and D103, a darlington-connected transistor switch Q101, a base resistor R101, and a speed-up capacitor C101.

Processing unit 130 also produces an IF AGC signal which is coupled to controller 110 via a wire 131, for detection of variation of the signal strength of signals of currently-tuned channels, the changes being indicative of channel changes. Alternatively, video signal processor 155 produces at a filter terminal 157 a valid sync detection signal (or a video AGC signal) which is coupled to controller 110 from a SYNC or AGC DETECTOR 156 via a wire 151, for detection of changes in the detection of valid TV sync or changes in the AGC signal, changes being indicative of channel changes.

It is herein recognized that it is a clear advantage for the unit which contains the VCR PLUS™ control code (in the subject case, the VCR) for controlling the cable box, to be coupled to the television antenna line, so that the controller can determine whether or not the cable box is actually responding to transmitted IR commands. Copending U.S. patent application Ser. No. 806,918 concerns the problem that there are about 44 different cable box IR remote control command formats. With an "open loop" type of system, such as implemented in the VCR PLUS™ handunit, the controller has no way of knowing if the cable box responds to the transmitted command or not. Thus, if the cable box is inadvertently switched to select the wrong cable box command code format, the desired channel change will not be accomplished, and the desired program will not be recorded.

In contrast, apparatus according to copending U.S. patent application Ser. No. 806,918 controls the cable box (i.e., the source of its own video input signals), and monitors the television signals received from the cable box, in a "closed loop" manner. By monitoring the SYNC or AGC signal from video processor 155 of FIG. 1, controller 110 can detect perturbations of the signal level which indicate that the cable box is, in fact, receiving and executing commands as indicated by the fact that it can change channels.

Advantageously, if a signal which tracks a characteristic of the baseband video signal (such as Valid Sync Detect or baseband video AGC) is used for detecting loss of signal during channel change, then the subject invention is applicable to use with cable boxes which produce decoded cable television signals at baseband rather than remodulating them to a particular television channel frequency.

The present invention will be further described with reference to FIGS. 2a and 2b, and 3.

Figure 2A:
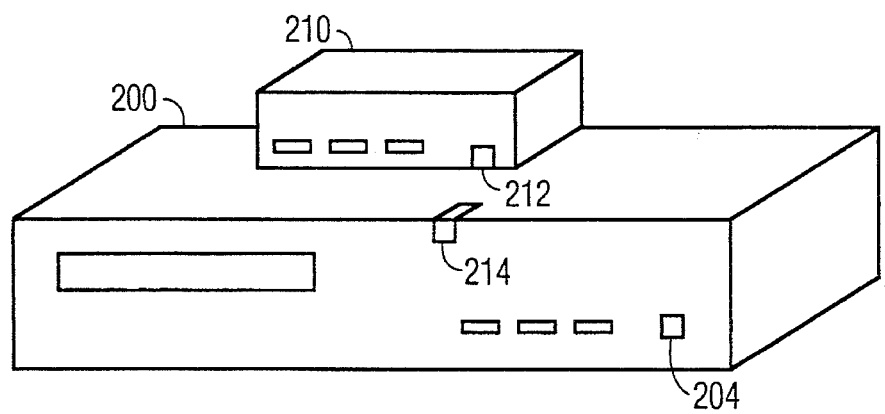
FIGS. 2a and 2b are views of a VCR incorporating the invention.
Figure 2B:
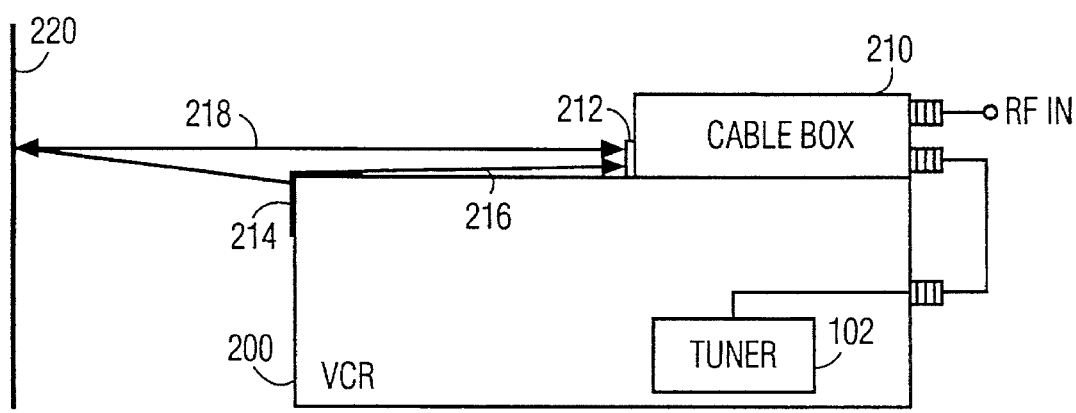

FIG. 2a is a perspective view of a cable box 210 placed VCR 200 having a, In FIG. 2b, VCR 200 is shown coupled to the RF input via cable box 210. Tuner 102 of FIG. 2b is the same tuner unit 102 previously described with respect to FIG. 1. It is common practice for cable television services to encode (i.e., scramble) at least their "Premium" channels. FIG. 2b is a configuration which may be used when some or all of the television channels provided by the cable television service are encoded in some fashion (i.e., a cable box is required for decoding). In such a configuration, the VCR will be set to record all television programs on the cable box output channel (typically, channel 2, 3, 4 or 5). Cable box 210 of FIGS. 2a and 2b includes a window 212 for admitting an IR (infrared) remote control signal for turning the cable box on and off, and for causing the tuner of the cable box to change channels. VCR 200 of FIG. 2a includes a window 204 for admitting an IR (infrared) remote control signal for turning the VCR on and off, for causing the tuner 102 of the VCR to change channels, and for controlling the recording and playback of videotapes. VCR 200 also includes a window 214 through which IR signals generated by the VCR are transmitted to external units such as cable box 210. Note from FIG. 2b that cable box 210 preferably receives IR signals from window 214 of VCR 200 along a rearward directed path 216, and from a "bounce" path 218 in which the IR signals may be reflected from a wall or other object 220. The rearward direction of the IR light provides more assurance that the VCR-generated IR commands will reach the cable box. It is important to note that because the "bounce" IR light path 218 is always longer than the more direct rearward path 216, more IR power is required to ensure remote control signal reception at the cable box. For this reason, two IR LEDs are directed along the longer bounce path. The two generally forward-facing LEDs may also be angled outward from each other (i.e., along diverging paths) in order to cover more area and increase the chance of reflecting a signal back to the cable box. The "bounce" path is provided for the case in which the user chooses not to place the cable box on top of the VCR.

Figure 3:
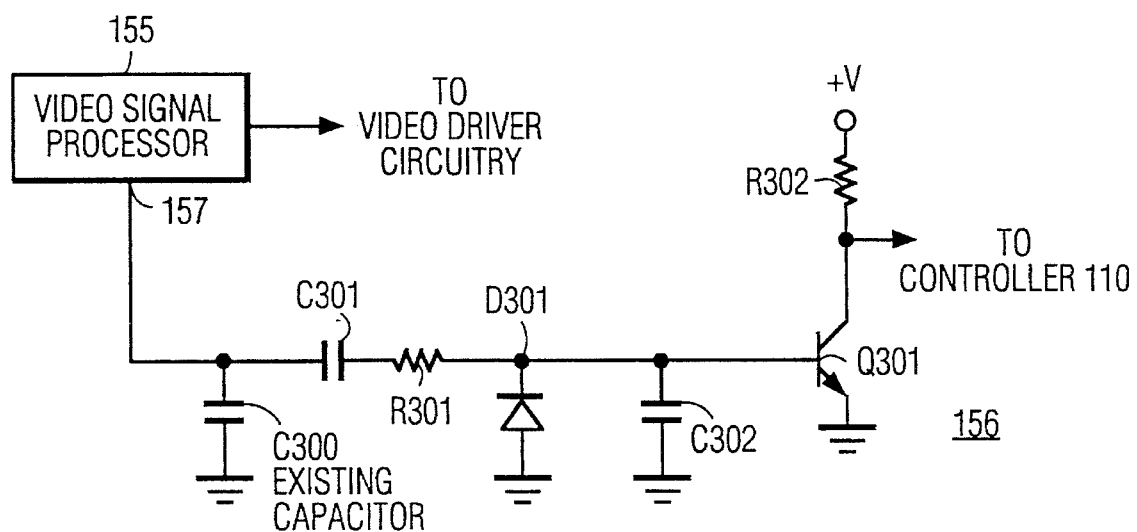
FIG. 3 is a detailed view of the SYNC or AGC detector of FIG. 1.

Referring to FIG. 3, a video processor integrated circuit 155, which may be an AN3248NK manufactured by Toshiba, includes a filter terminal 157 which may be one of a sync detector filter terminal and an AGC terminal to which external filter capacitors are to be connected. Such an external filter capacitor C300 is shown in FIG.3. Heretofore, no external circuitry has been connected across external filter capacitor C300. It is herein recognized that when an external source of television signals such as a cable box, changes channels a large and rapid signal level change is developed across filter capacitor C300, and that the large signal change can be detected, amplified, and applied to controller 110 as a feedback signal for channel change commands transmitted to the cable box. It is noted that either of the sync detector filter terminal or the AGC filter terminal can be used as a source of a detection signal for the subject invention. The sync detector filter terminal was chosen because it produces a signal with a larger signal swing when the cable box changes channels.

Normally, there is only a small ripple on the signal level across filter capacitor C300. When there is a large change in television signal level, such as what happens between channels when the tuner of the cable box is changing, the ripple in the voltage across filter capacitor C300 increases to approximately 2 volts peak-to-peak. Coupling capacitor C301 removes the DC component from the "ripple" signal and applies the signal to a common emitter configured transistor amplifier Q301 via a base current limiting resistor R301. Positive-going transitions of the ripple signal turn Q301 on. The output signal is taken at the junction of the collector of Q301 and its collector resistor R302. The output signal comprises negative-going signals having pulse widths from 0.1 milliseconds to 5 milliseconds, and averaging about 1 millisecond in duration. Diode D301 and resistor R301 form a clamp circuit which clamps the negative-going transitions of the ripple signal. Capacitor C302 is optional, but has been found to limit some of the high frequencies, and reduce false triggering.

Although the VCR PLUS™ system is referred to in the subject specification, it is herein recognized that the subject invention does not require the use of the VCR PLUS™ system and is extremely useful with standard timer recording.

What is claimed is:

1. A videocassette recorder comprising:
   a radio frequency (RF) signal input terminal, for receiving a particular of RF signal from a controllable external source of RF signals having a first toner being capable of tuning to a plurality of channels;
   said videocassette recorder further including,
   a second tuner coupled to said RF signal input terminal for receiving said particular of RF signal, said second tuner tuning said particular RF signal in response to a control signal:
   a video processor having an input coupled to said second tuner means for receiving and processing a video signal derived from said particular RF signal and having an AGC output filter terminal or a sync detector output filter terminal at which is developed an indicating signal; and
   a controller for generating said control signal for causing said second tuner to tune said particular RF signal;
   a data entry unit, coupled to said controller, for entering data in response to operation by a user;
   a transmitter coupled to said controller for transmitting a remote control signal for controlling said controllable external source of said RF signals; and
   a detector for detecting signal level at one of said AGC output filter terminal and said sync detector output filter terminal of said video processor means, and producing a detection signal in response thereto and applying said detection signal to said controller, said indicating signal exhibiting a perturbation when said first tuner is tuned from channel to channel;
   said detector comprising an amplifier having an input coupled to said AGC output filter terminal or said sync detector output filter terminal and an output at which said detection signal is developed.

2. The videocassette recorder of claim 1, wherein said amplifier is an AC-coupled amplifier.

3. The videocassette recorder of claim 2, wherein said amplifier includes a clamp circuit for attenuating negative-going transitions of said perturbation of said indicating signal.

4. A videocassette recorder comprising:
   video processing means having an input for receiving an output television signal from a controllable external source of television signals, and having an AGC output filter terminal at which is developed an indicating signal;
   said controllable external source of television signals including a tuner means for tuning television channels in response to a received command and providing a signal derived from a tuned one of said television channels as said output television signal;
   said video cassette recorder further including detector means for detecting signal amplitude at said AGC output filter terminal of said video processor means, and producing a detection signal in response to a perturbation of said amplitude of said indicating signal, said indicating signal exhibiting said perturbation when said tuner of said controllable external source of television signals is tuned from channel to channel; and
   control means for issuing said command to said external source of television signals;
   said detector means comprising an amplifier having an input coupled to said AGC filter terminal, said detector producing said detection signal in response to said perturbation of signal amplitude which exceed a predetermined threshold.

5. The videocassette recorder of claim 4, wherein said amplifier is an AC-coupled amplifier.

6. The videocassette recorder of claim 5, wherein said amplifier includes a clamp circuit for attenuating negative-going transitions of said perturbation of said indicating signal.

7. A videocassette recorder comprising:
   video processing means having an input for receiving an output television signal from a controllable external source of television signals, and having a sync detector output filter terminal at which is developed an indicating signal;
   said controllable external source of television signals including a tuner means for tuning television channels in response to a received command and providing a signal derived from a tuned one of said television channels as said output television signal;
   said video cassette recorder further including detector means for detecting signal amplitude at said sync detector output filter terminal of said video processor means, and producing a detection signal in response to a perturbation of said amplitude of said indicating signal, said indicating signal exhibiting said perturbation when said tuner of said controllable external source of television signals is tuned from channel to channel; and
   control means for issuing said command to said external source of television signals;
   said detector means comprising an amplifier having an input coupled to said sync detector output filter terminal, said detector producing said detection signal in response to said perturbation of signal amplitude which exceeds a predetermined threshold.

8. The videocassette recorder of claim 7, wherein said amplifier is an AC-coupled amplifier.

9. The videocassette recorder of claim 8, wherein said amplifier includes a clamp circuit for attenuating negative-going transitions of said perturbation of said indicating signal.

* * * * *